United States Patent
Wu et al.

(10) Patent No.: US 12,002,805 B2
(45) Date of Patent: Jun. 4, 2024

(54) LOCAL VERTICAL INTERCONNECTS FOR MONOLITHIC STACK TRANSISTORS

(71) Applicant: International Business Machines Corporation, Armonk, NY (US)

(72) Inventors: Heng Wu, Guilderland, NY (US); Ruilong Xie, Niskayuna, NY (US); Chen Zhang, Guilderland, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 17/445,013

(22) Filed: Aug. 13, 2021

(65) Prior Publication Data

US 2023/0051674 A1 Feb. 16, 2023

(51) Int. Cl.
  *H01L 27/06* (2006.01)
  *H01L 21/822* (2006.01)
  *H01L 21/8234* (2006.01)
  *H01L 27/088* (2006.01)

(52) U.S. Cl.
  CPC ...... *H01L 27/0688* (2013.01); *H01L 21/8221* (2013.01); *H01L 21/823475* (2013.01); *H01L 27/088* (2013.01)

(58) Field of Classification Search
  CPC ......... H01L 21/8221; H01L 21/823475; H01L 27/0688; H01L 27/088; H01L 29/41733; H01L 29/4175; H01L 29/41766; H01L 21/76805; H01L 21/76897; H01L 21/76898

See application file for complete search history.

(56) References Cited

U.S. PATENT DOCUMENTS

| | | | |
|---|---|---|---|
| 5,612,563 A | 3/1997 | Fitch et al. | |
| 8,853,785 B2 | 10/2014 | Augendre et al. | |
| 9,064,849 B2 | 6/2015 | Zhu | |
| 9,685,436 B2 | 6/2017 | Morrow et al. | |
| 9,711,501 B1 | 7/2017 | Basker et al. | |
| 9,929,149 B2 | 3/2018 | Sinha et al. | |
| 10,192,819 B1 | 1/2019 | Chanemougame et al. | |
| 10,283,411 B1 | 5/2019 | Hook et al. | |
| 10,297,592 B2 | 5/2019 | Morrow et al. | |
| 2007/0181882 A1* | 8/2007 | Lee | H01L 27/0688 257/67 |
| 2019/0214313 A1 | 7/2019 | Leobandung | |

(Continued)

OTHER PUBLICATIONS

International Search Report and Written Opinion, International Application No. PCT/CN2022/106767, Oct. 10, 2022, 9 pgs.

(Continued)

*Primary Examiner* — Robert G Bachner
*Assistant Examiner* — Molly K Reida
(74) *Attorney, Agent, or Firm* — Kelli D. Morin

(57) ABSTRACT

A method for forming a stacked transistor includes forming a sacrificial cap over a first interconnect of a lower level transistor. The method further includes forming an upper level transistor above the sacrificial cap. The method further includes removing the sacrificial cap to form an opening such that the opening is delimited by the upper level transistor. The method further includes forming a second interconnect in the opening such that the second interconnect is in direct contact with the first interconnect.

7 Claims, 15 Drawing Sheets

(56) References Cited

U.S. PATENT DOCUMENTS

| | | |
|---|---|---|
| 2020/0006330 A1 | 1/2020 | Lilak et al. |
| 2020/0135646 A1 | 4/2020 | Rubin et al. |
| 2020/0211910 A1* | 7/2020 | Yin .................... H01L 21/8221 |
| 2023/0051857 A1* | 2/2023 | Lee ................... H01L 29/78648 |

OTHER PUBLICATIONS

Rachmady et al., "300mm Heterogeneous 3D Integration of Record Performance Layer Transfer Germanium PMOS with Silicon NMOS for Low Power High Performance Logic Applications," International Electron Devices Meeting (IEDM), 29.7, 4 pp.

* cited by examiner

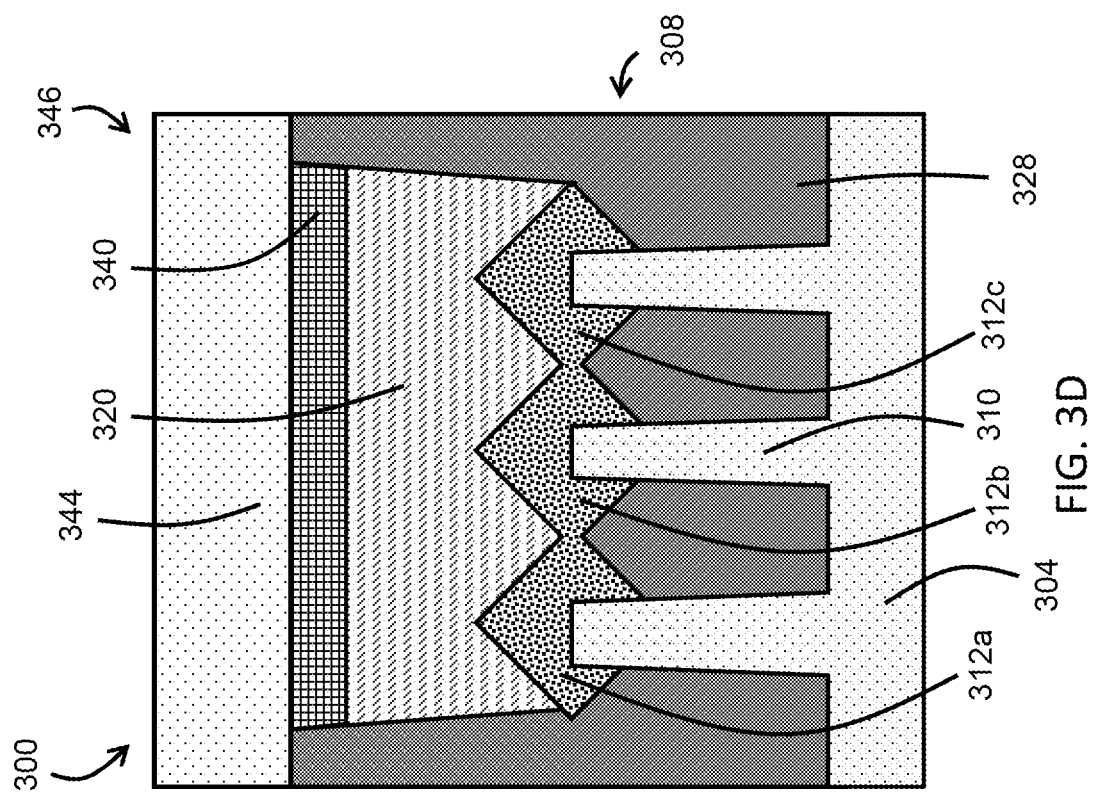
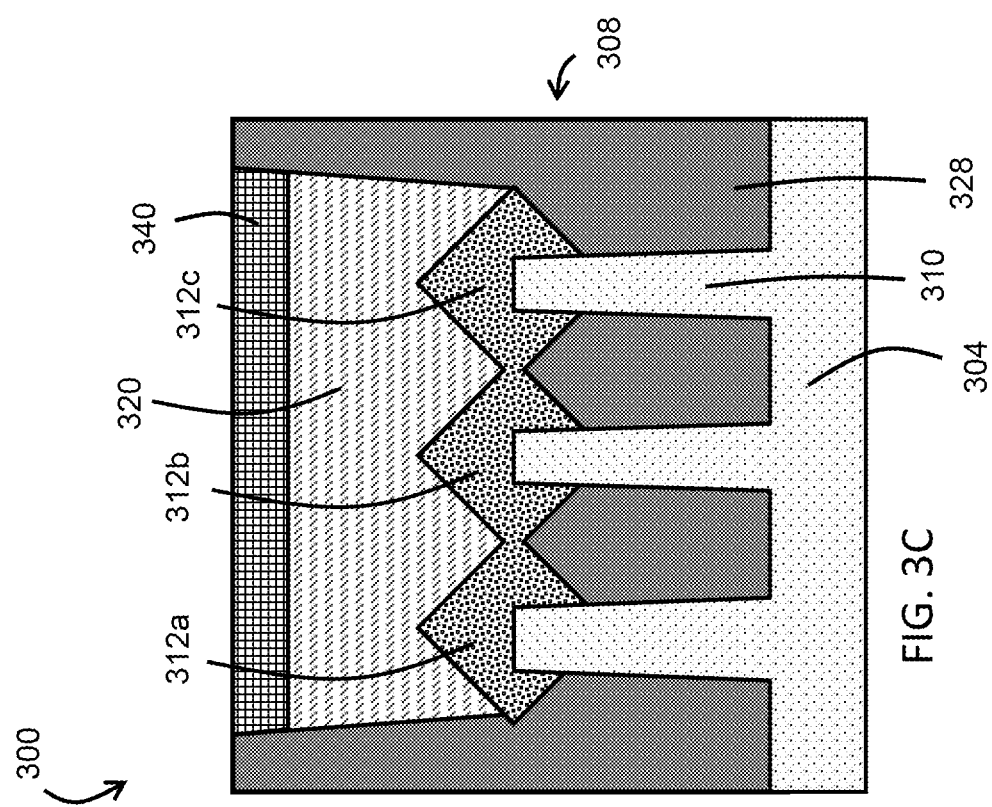

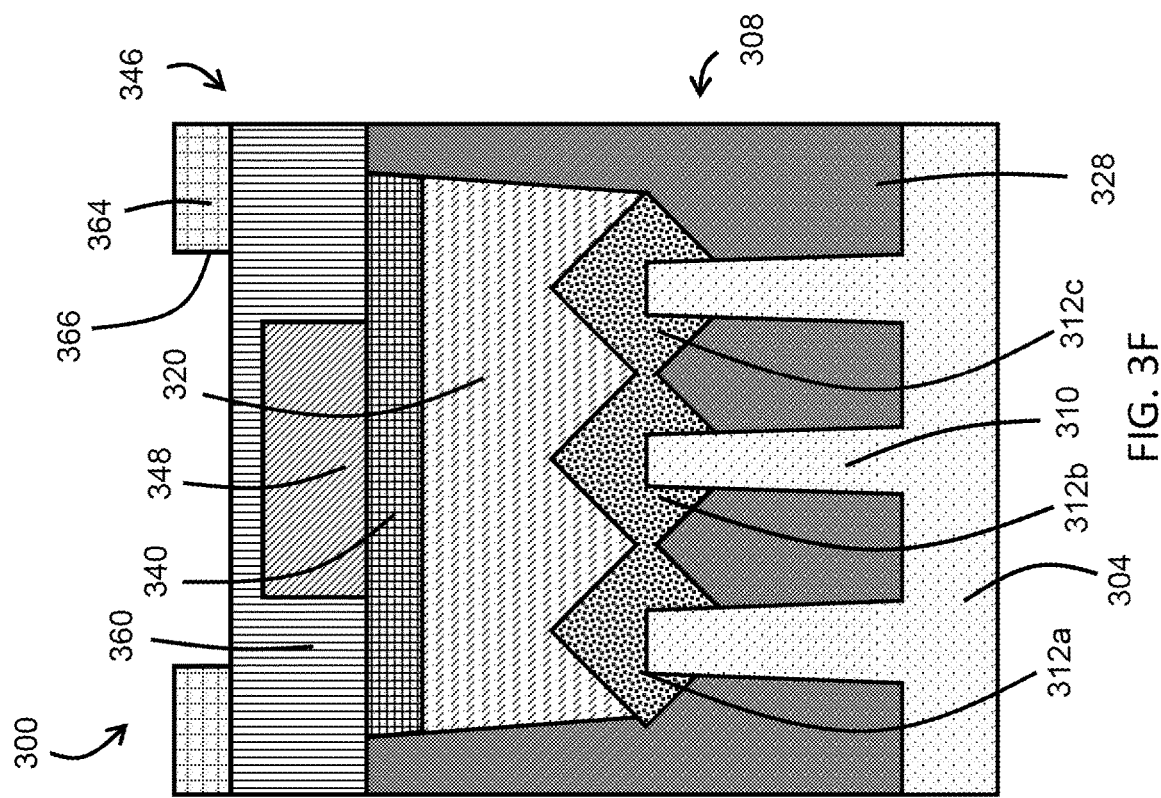
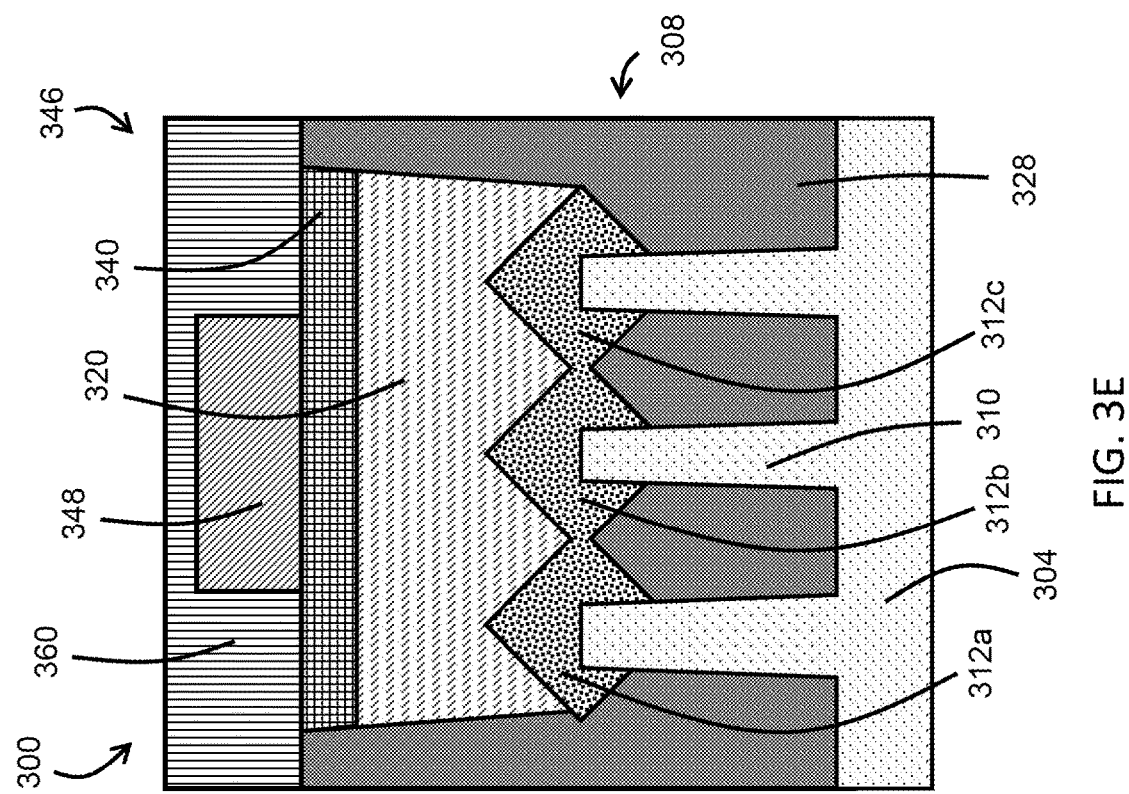
FIG. 3F
FIG. 3E

LOCAL VERTICAL INTERCONNECTS FOR MONOLITHIC STACK TRANSISTORS

BACKGROUND

The present disclosure relates to the semiconductor device fields. In particular, the present disclosure relates to semiconductor devices having stacked transistors.

In an integrated circuit including metal-oxide-semiconductor (MOS) transistors, these transistors are generally produced from a single semiconductor layer in which the channels of these transistors are formed. This semiconductor layer is topped with metal interconnections forming contacts electrically connected to the gates and to the source and drain regions of the transistors. One strategy for improving the integration density of the MOS transistors in the integrated circuits is to produce integrated circuits including multiple stacked layers of transistors. Relative to transistors produced from a single semiconductor layer, a stacked structure makes it possible to increase the integration density of the transistors in the integrated circuit.

SUMMARY

Embodiments of the present disclosure include a method for forming a stacked transistor. The method includes forming a sacrificial cap over a first interconnect of a lower level transistor. The method further includes forming an upper level transistor above the sacrificial cap. The method further includes removing the sacrificial cap to form an opening such that the opening is delimited by the upper level transistor. The method further includes forming a second interconnect in the opening such that the second interconnect is in direct contact with the first interconnect.

Additional embodiments of the present disclosure include a computer program product comprising a computer readable storage medium having program instructions embodied therewith, the program instructions being executable by a computer system to cause the computer system to perform a method for forming a stacked transistor. The method includes forming a sacrificial cap over a first interconnect of a lower level transistor. The method further includes forming an upper level transistor above the sacrificial cap. The method further includes removing the sacrificial cap to form an opening such that the opening is delimited by the upper level transistor. The method further includes forming a second interconnect in the opening such that the second interconnect is in direct contact with the first interconnect.

Additional embodiments of the present disclosure include semiconductor device. The semiconductor device includes a lower level transistor, and upper level transistor, and a dielectric cap. The lower level transistor includes a first source, a first drain, a first interconnect in direct contact with one of the first source and the first drain, and a second interconnect in direct contact with the other of the first source and the first drain. The upper level transistor includes a second source, a second drain, a third interconnect in direct contact with one of the second source and the second drain, and a fourth interconnect in direct contact with the other of the second source and the second drain. The dielectric cap is arranged in direct contact with the second interconnect. The first interconnect and the second interconnect are arranged between the lower level transistor and the upper level transistor.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIG. 2I illustrates a cross-sectional schematic view of an example of a structure following the performance of a portion of the example method of FIG. 1, in accordance with embodiments of the present disclosure.

FIG. 3C illustrates a cross-sectional schematic view of an example of a structure following the performance of a portion of the example method of FIG. 1, in accordance with embodiments of the present disclosure.

FIG. 3D illustrates a cross-sectional schematic view of an example of a structure following the performance of a portion of the example method of FIG. 1, in accordance with embodiments of the present disclosure.

FIG. 3E illustrates a cross-sectional schematic view of an example of a structure following the performance of a portion of the example method of FIG. 1, in accordance with embodiments of the present disclosure.

FIG. 3F illustrates a cross-sectional schematic view of an example of a structure following the performance of a portion of the example method of FIG. 1, in accordance with embodiments of the present disclosure.

DETAILED DESCRIPTION

Figure 1:
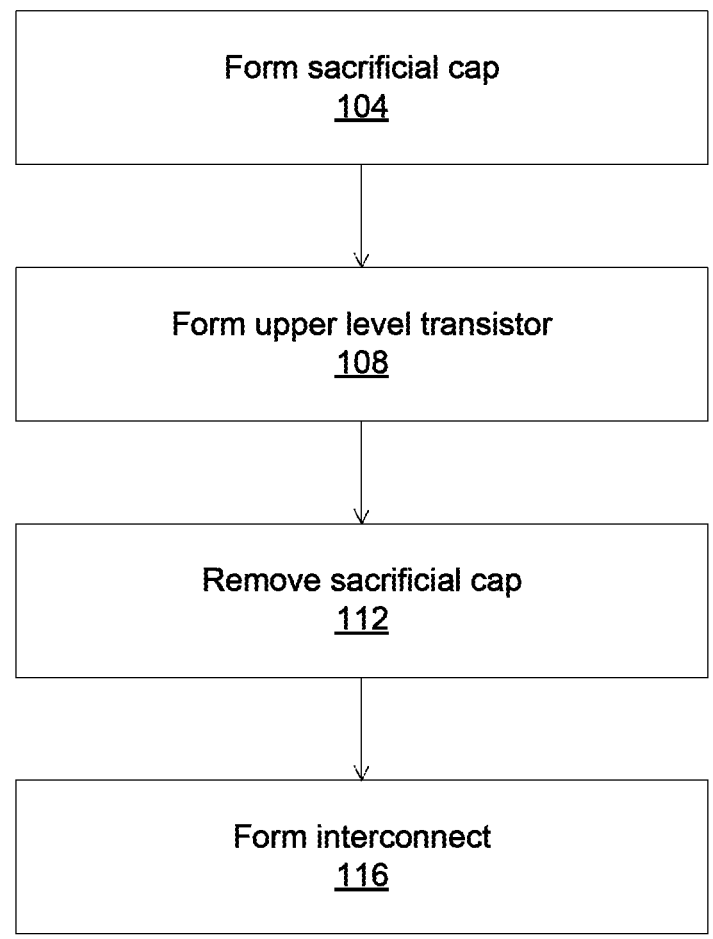
FIG. 1 illustrates a flowchart of an example method for forming a stacked transistor, in accordance with embodiments of the present disclosure.

Aspects of the present disclosure relate generally to the electrical, electronic, and computer fields. In particular, the present disclosure relates to semiconductor devices having stacked transistors. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (ME). In general, ME uses chemically reactive plasma to remove material deposited on wafers. With RIE the plasma is generated under low pressure (vacuum) by an electromagnetic field. High-energy ions from the ME plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, planar transistors are often used to fabricate integrated circuit logic devices. A planar transistor has a source electrode and drain electrode which are laterally separated by a channel region. Overlying the channel region is a gate electrode that is typically separated from the channel region by a gate oxide. Planar transistors, although used and useful in many integrated circuit logic applications, are area intensive and consume a large amount of substrate area per transistor. In addition, with integrated circuit geometries decreasing into sub-micron ranges, planar transistors have various disadvantages.

One strategy for improving the integration density of MOS transistors in integrated circuits is to produce integrated circuits including multiple stacked layers of transistors. Relative to transistors produced from a single semiconductor layer, a stacked structure makes it possible to increase the integration density of the transistors in the integrated circuit. Some transistor stacking strategies include bonding a complete bottom chip wafer to a complete upper chip wafer. Such strategies employ what may be referred to as "package layer integration." However, one drawback of such strategies is that all of the functionality on each completed chip wafer is isolated prior to bonding. In other words, the transistors on different layers of the resulting semiconductor may be dedicated to different circuit functionalities. Accordingly, the resulting stacked structures of such strategies are limited in terms of their combined functionality. It is necessary to then connect these transistors in certain ways to achieve the intended functionality of the circuit. Additionally, any vertical connections between the two chips must be built into the wafers before bonding or created in the stack after bonding, both of which can be difficult to execute. Embodiments of the present disclosure are directed toward structures and methods of forming functional interconnections between transistors on different layers of semiconductors.

More specifically, it is desirable to be able to heterogeneously integrate transistors at different levels of the stacked structure. Such heterogeneous integration enables greater flexibility for the stacked transistor. Embodiments of the present disclosure may facilitate heterogeneous integration of transistors by selectively providing local vertical interconnects between upper and lower levels of transistors. Accordingly, embodiments of the present disclosure are applicable to monolithic stack transistors. Such local interconnects provide flexibility for routing or wiring for the stacked transistor, which can greatly increase the functionalities that are possible for the stacked structure.

FIG. 1 depicts a flowchart of an example method 100 for forming local vertical interconnects for monolithic stack transistors, according to embodiments of the present disclosure. The method 100 begins with operation 104, wherein a sacrificial cap is formed. More specifically, the sacrificial cap is formed so as to cover at least one interconnect of a lower level transistor. In other words, the sacrificial cap is formed over an interconnect of a lower level transistor. The at least one interconnect is connected to one of a sink electrode and a drain electrode of a transistor. In particular, the interconnect is recessed prior to forming the sacrificial cap, and the sacrificial cap is formed in the recess. Accordingly, in accordance with at least some embodiments of the present disclosure, operation 104 can further include forming a recess in the interconnect prior to forming the sacrificial cap.

Notably, in typical integrated circuit fabrication techniques, many lower level transistors are formed on a shared lower level wafer. Accordingly, the lower level transistor discussed herein is one of many lower level transistors formed on a common lower level wafer. In other words, the present description describes a particular lower level transistor for illustrative purposes. However, the particular lower level transistor is part of a larger integrated circuit. Therefore, the fabrication techniques and operations performed in the method 100 may be performed for multiple stacked transistors in substantially the same manner as is described for the particular illustrative stacked transistors described herein.

Figure 2A:
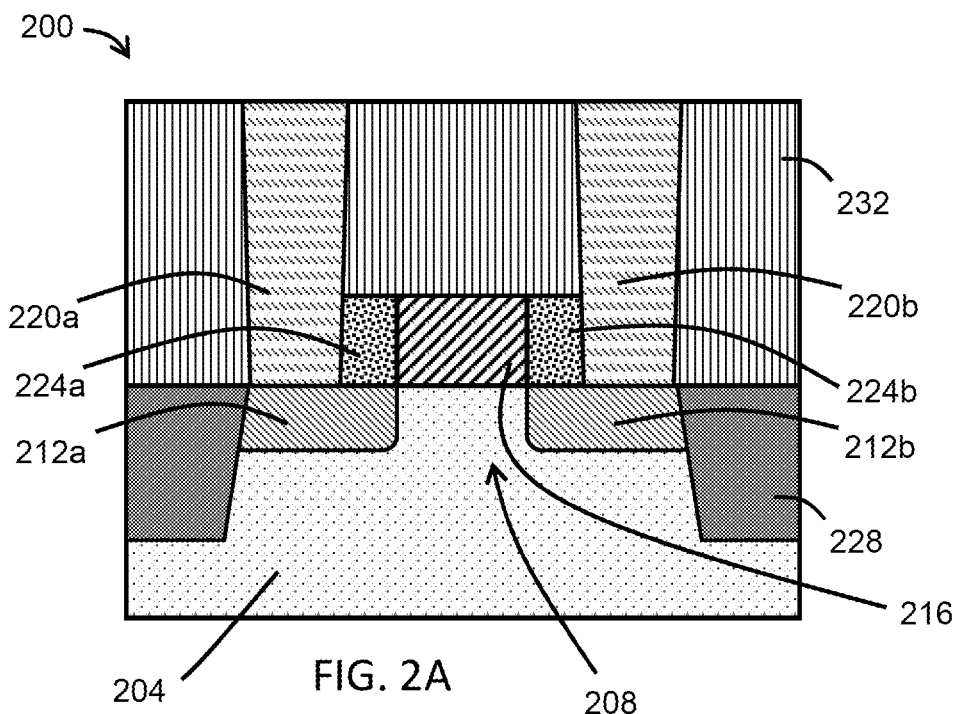
FIG. 2A illustrates a cross-sectional schematic view of an example of a structure for use in the performance of the example method of FIG. 1, in accordance with embodiments of the present disclosure.

FIG. 2A depicts an example structure 200 that can be used in the performance of method 100. FIG. 2A shows the example structure 200 prior to the performance of operation 104. In other words, some fabrication processes have already been performed in order to form the example structure 200 in the state shown in FIG. 2A.

As shown in FIG. 2A, the structure 200 includes a wafer 204 on which the monolithic stack transistor is built. The structure 200 also includes a lower level transistor 208 built on the wafer 204 that may be constructed using conventional techniques. In particular, the lower level transistor 208 includes regions of epitaxy material 212a, 212b that form the source electrode and the drain electrode of the lower level transistor 208. For the purposes of this disclosure, it is not important which of the electrodes 212a or 212b is the source electrode and which of the electrodes 212a or 212b is the drain electrode. Accordingly, the source and drain electrodes may also be referred to herein collectively as source and drain electrodes 212.

The source and drain electrodes 212 are separated by a channel, and the lower level transistor 208 further includes a gate 216 arranged over the channel with the gate dielectrics in between. Each of the source and drain electrodes 212a, 212b is in direct contact with a respective interconnect 220a, 220b, which may also be referred to as a "metal stud." The interconnects 220a, 220b project upwardly from the uppermost surface of the respective electrode 212a, 212b on opposite sides of the gate 216. The gate 216 is separated from each of the interconnects 220a, 220b by a respective spacer 224a, 224b. The spacers 224a, 224b electrically isolate the gate 216 from the interconnects 220a, 220b as well as the electrodes 212a, 212b.

The lower level transistor 208 also includes a shallow trench isolation (STI) layer 228 around the source and drain electrodes 212 and an interlayer dielectric (ILD) layer 232 around the interconnects 220a, 220b. The ILD layer 232 also fills the area between the interconnects 220a, 220b, above the gate 216 and spacers 224.

Figure 2B:
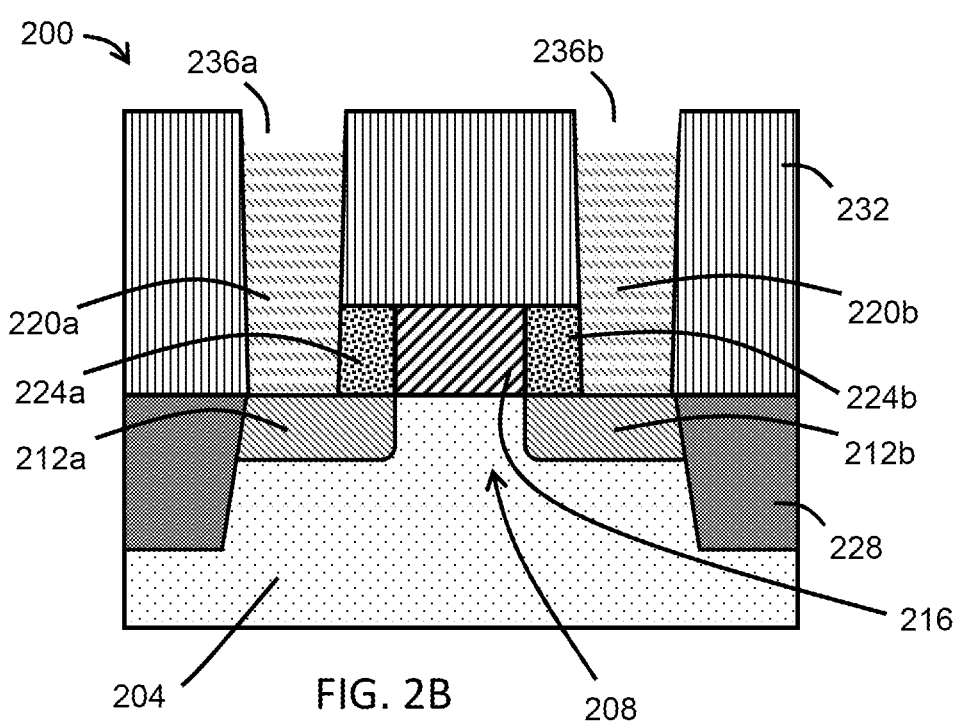
FIG. 2B illustrates a cross-sectional schematic view of an example of a structure following the performance of a portion of the example method of FIG. 1, in accordance with embodiments of the present disclosure.

As discussed above, with respect to FIG. 1, in accordance with at least some embodiments of the present disclosure, operation 104 can include recessing the interconnect prior to forming the sacrificial cap. FIG. 2B depicts the structure 200 following the performance of this portion of operation 104. As shown, both interconnects 220a, 220b have been recessed to form a recess 236a, 236b in the uppermost end of the respective interconnect 220a, 220b. As shown, the recesses 236a, 236b are surrounded by the ILD layer 232.

Figure 2C:
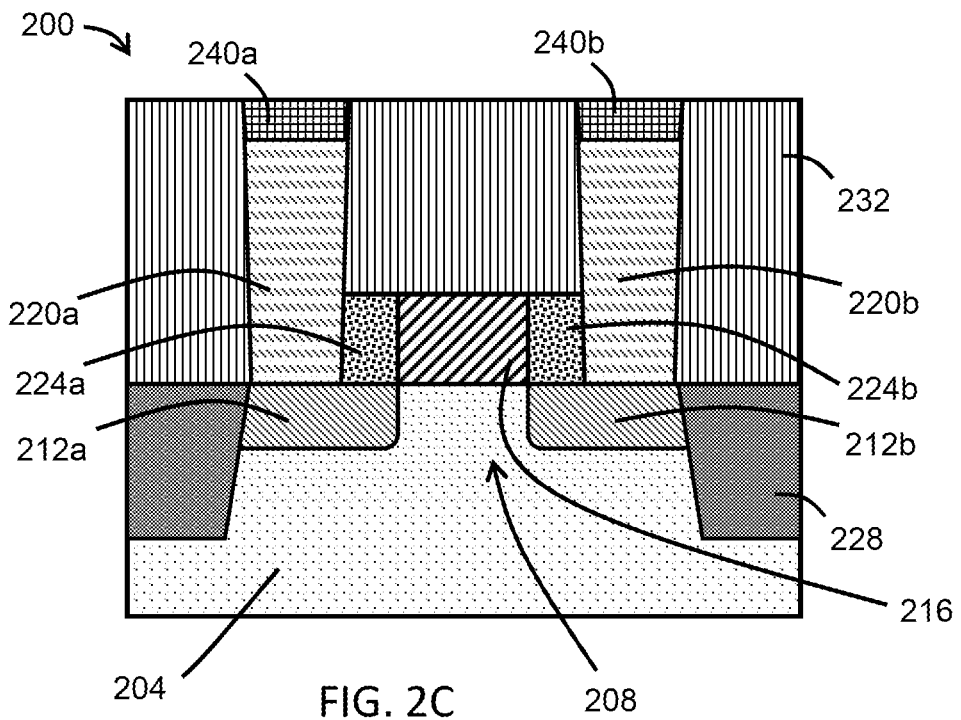
FIG. 2C illustrates a cross-sectional schematic view of an example of a structure following the performance of a portion of the example method of FIG. 1, in accordance with embodiments of the present disclosure.

FIG. 2C depicts the structure 200 following the performance of a subsequent portion of operation 104 in accordance with at least one embodiment of the method 100. In particular, FIG. 2C depicts sacrificial caps 240a, 240b formed in the respective recesses 236a, 236b (shown in FIG. 2B). Accordingly, forming a sacrificial cap can include forming more than one sacrificial cap. In particular, forming a sacrificial cap can include forming a sacrificial cap on each interconnect of the lower level transistor. As shown in FIG. 2C, because they are formed in the recesses, the sacrificial caps 240a, 240b are formed in the ILD layer 232.

In accordance with at least one embodiment of the present disclosure, the sacrificial caps 240a, 240b can be formed of a dielectric material. In one non-limiting example, the sacrificial caps 240a, 240b can be formed of a metal oxide. In a particular non-limiting example, the sacrificial caps 240a, 240b can be formed of titanium oxide. As shown, the sacrificial caps 240a, 240b cover the uppermost ends of the interconnects 220a, 220b and therefore provide electrical isolation thereto.

Returning to FIG. 1, following the performance of operation 104, the method 100 proceeds with operation 108, wherein an upper level transistor is formed. More specifically, the upper level transistor is formed above the sacrificial cap(s). Additionally, in accordance with some embodiments of the present disclosure, the upper level transistor is formed above a layer of ILD material. In accordance with some embodiments of the present disclosure, the upper level transistor is formed above a layer of STI material. In accordance with some embodiments of the present disclosure, the upper level transistor is formed above a layer of STI material and a layer of ILD material.

In accordance with at least one embodiment of the present disclosure, the upper level transistor is formed such that the wafer of the upper level transistor is initially in direct contact with the sacrificial cap and such that at least one of the source and drain electrodes formed in the wafer is subsequently in direct contact with the sacrificial cap.

In accordance with at least one embodiment of the present disclosure, forming the upper level transistor includes forming a wafer that corresponds to the upper level transistor, forming source and drain electrodes in the wafer that correspond to the upper level transistor, forming a gate that corresponds to the upper level transistor, forming spacers that correspond to the upper level transistor, and forming an ILD layer that corresponds to the upper level transistor. As described in further detail below, the formation of the upper level transistor at operation 108 does not include forming interconnects for the upper level transistor. Advantageously, the interconnects for the upper level transistor are formed during a subsequent operation of the method 100.

Figure 2D:
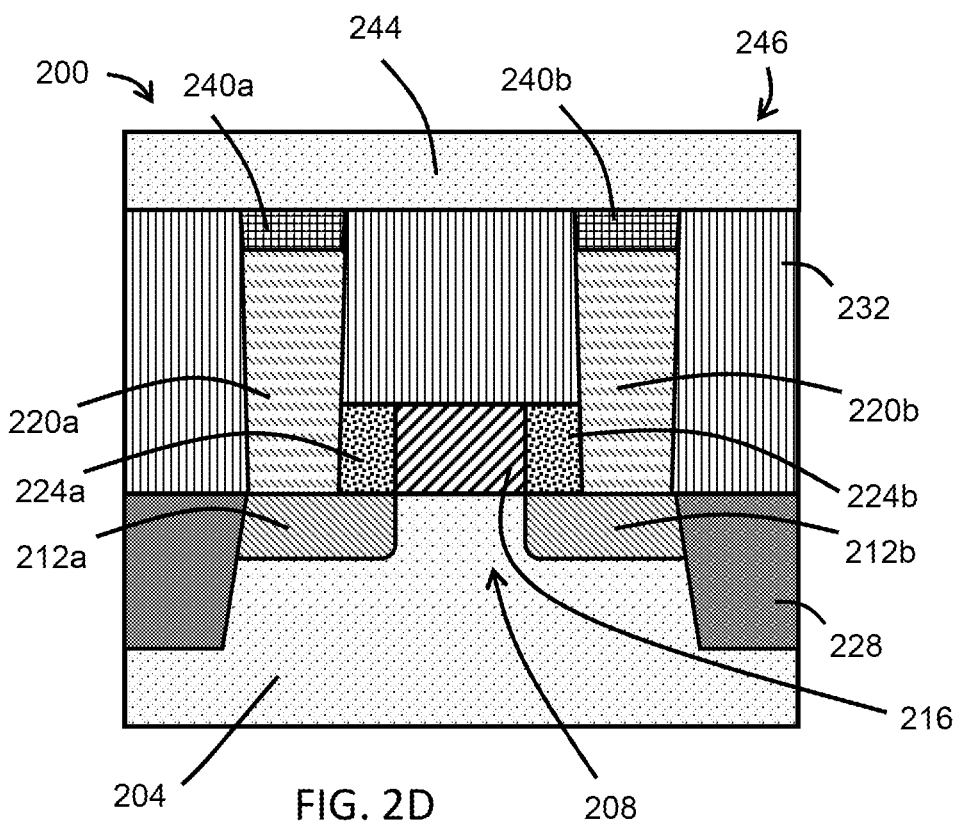
FIG. 2D illustrates a cross-sectional schematic view of an example of a structure following the performance of a portion of the example method of FIG. 1, in accordance with embodiments of the present disclosure.

FIG. 2D depicts the example structure 200 following the performance of a first portion of operation 108. In particular, FIG. 2D depicts the example structure 200 following the formation of a wafer 244 of an upper level transistor 246. As shown, the wafer 244 is formed in direct contact with the sacrificial caps 240a, 240b. Additionally, the wafer 244 is formed in direct contact with the ILD layer 232.

Figure 2E:
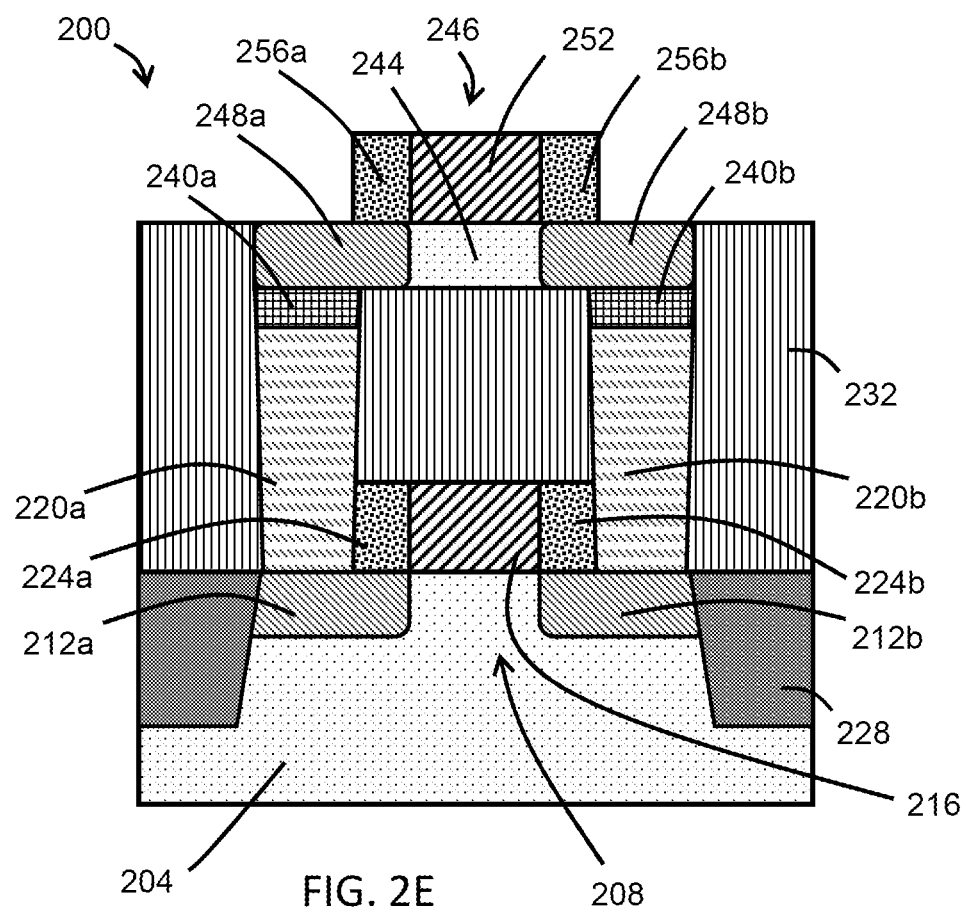
FIG. 2E illustrates a cross-sectional schematic view of an example of a structure following the performance of a portion of the example method of FIG. 1, in accordance with embodiments of the present disclosure.

FIG. 2E depicts the example structure 200 following the performance of a subsequent portion of operation 108 in accordance with at least one embodiment of the method 100. In particular, FIG. 2E depicts the example structure 200 following the formation of source and drain electrodes 248a, 248b of the upper level transistor 246, a gate 252 of the upper level transistor 246, and spacers 256a, 256b of the upper level transistor 246. The source and drain electrodes 248a, 248b of the upper level transistor 246 are substantially similar in structure and function to the source and drain electrodes 212a, 212b of the lower level transistor 208. Likewise, the gate 252 of the upper level transistor 246 is substantially similar in structure and function to the gate 216 of the lower level transistor 208, and the spacers 256a, 256b of the upper level transistor 246 are substantially similar in structure and function to the spacers 224a, 224b of the lower level transistor 208.

The source and drain electrodes 248a, 248b of the upper level transistor 246 are substantially vertically aligned with the source and drain electrodes 212a, 212b of the lower level transistor 208. Likewise, the gate 252 of the upper level transistor is substantially vertically aligned with the gate 216 of the lower level transistor, and the spacers 256a, 256b of the upper level transistor 246 are substantially vertically aligned with the spacers 224a, 224b of the lower level transistor 208.

Figure 2F:
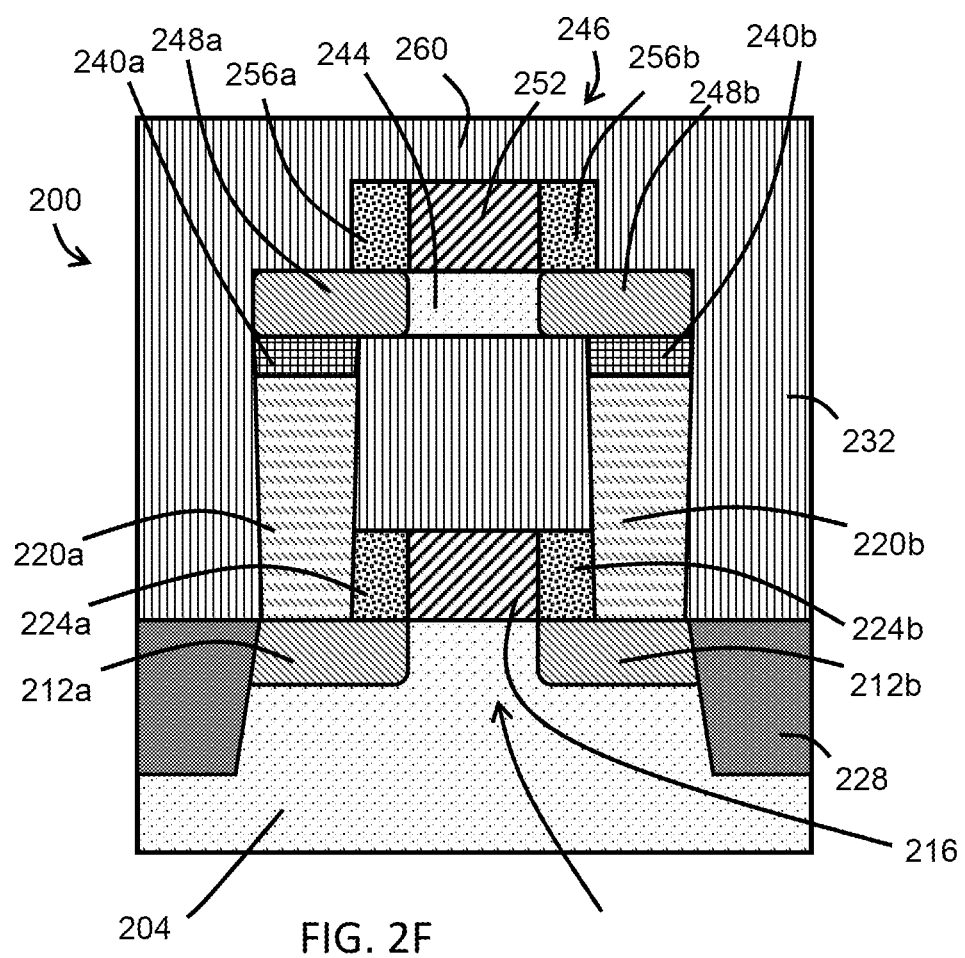
FIG. 2F illustrates a cross-sectional schematic view of an example of a structure following the performance of a portion of the example method of FIG. 1, in accordance with embodiments of the present disclosure.

FIG. 2F depicts the example structure 200 following the performance of a subsequent portion of operation 108 in accordance with embodiments of the method 100. In particular, FIG. 2F depicts the example structure 200 following the formation of an ILD layer 260 of the upper level transistor 246. The ILD layer 260 of the upper level transistor 246 is substantially similar in structure and function to the ILD layer 232 of the lower level transistor 208. In accordance with at least some embodiments of the present disclosure, the ILD layer 260 of the upper level transistor 246 and the ILD layer 232 of the lower level transistor 208 become interconnected upon formation of the ILD layer 260 on top of the ILD layer 232.

Returning to FIG. 1, following the performance of operation 108, the method 100 proceeds with operation 112, wherein a sacrificial cap is removed. More specifically, the sacrificial cap that is formed on one of the interconnects of the lower level transistor is selectively removed. In accordance with at least one embodiment of the present disclosure, the sacrificial cap that is formed on the other one of the interconnects of the lower level transistor is selectively left intact. For example, the sacrificial cap that is formed on the interconnect that is in contact with the source electrode can be selectively removed and the sacrificial cap that is formed on the interconnect that is in contact with the drain electrode can be selectively left intact. In accordance with at least one alternative embodiment of the present disclosure, the sacrificial caps that are formed on the opposite interconnects can be removed and left intact. For example, the sacrificial cap that is formed on the interconnect that is in contact with the source electrode can be left intact and the sacrificial cap that is formed on the interconnect that is in contact with the drain electrode can be removed. In accordance with at least one other alternative embodiment of the present disclosure, both sacrificial caps can be removed.

As noted above, the particular lower level transistor described herein is illustrative of many lower level transistors formed on the wafer. In accordance with at least one alternative embodiment, neither of the sacrificial caps can be removed on the particular lower level transistor. In such embodiments, one or more corresponding sacrificial caps can be selectively removed from one or more other transistors that are formed elsewhere on the wafer.

The ability to selectively remove one, either, or both sacrificial caps from any lower level transistor on the common wafer provides great flexibility and versatility for the stacked wafer by controlling which particular upper level transistors will be able to be electrically connected to lower level transistors. Even more specifically, it is further possible to control whether it is the source electrode or the drain electrode that will be able to be electrically connected to the lower level transistor. Accordingly, the performance of operation 112 enables subsequent formation of local vertical interconnects at controlled locations in the stacked transistor.

The performance of operation 112 includes forming an opening in the ILD layers of the upper and lower level transistors down to the level of the sacrificial cap. The opening can be formed, for example, by selectively masking and etching. In particular, the opening can be formed such that it is delimited by the ILD layers, by the spacer and electrode of the upper level transistor, and by the sacrificial cap that is to be subsequently removed. The sacrificial cap is then able to be removed by way of the opening. Upon removal of the sacrificial cap, the opening is delimited by the ILD layers, by the spacer and electrode of the upper level transistor, and by the interconnect from which the sacrificial cap was removed.

Figure 2G:
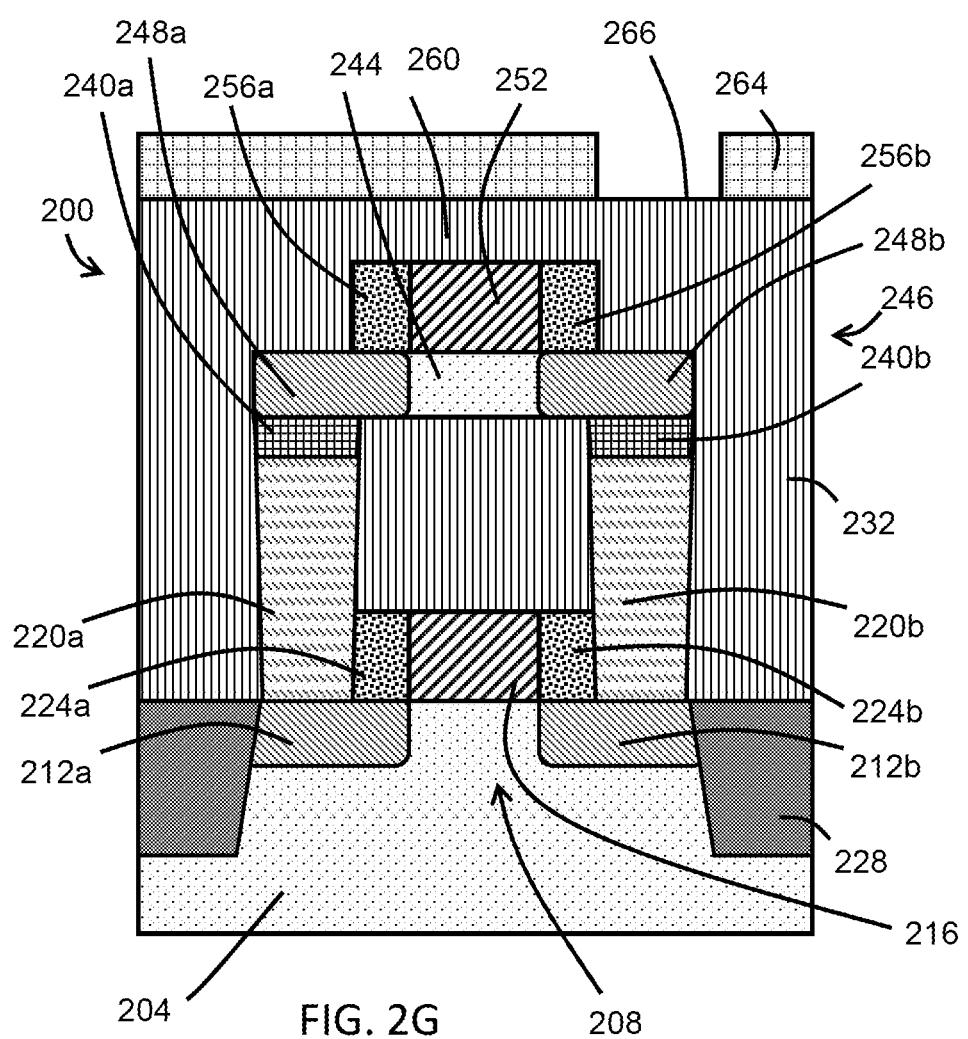
FIG. 2G illustrates a cross-sectional schematic view of an example of a structure following the performance of a portion of the example method of FIG. 1, in accordance with embodiments of the present disclosure.

FIG. 2G depicts the example structure 200 following the performance of a portion of operation 112 in accordance with at least one embodiment of the method 100. In particular, FIG. 2G depicts the formation of a photoresist layer 264 on top of the ILD layer 260 of the upper level transistor. As shown, the photoresist layer 264 includes a gap 266 that is arranged generally vertically above the interconnect 220b. More specifically, the gap 266 is arranged vertically above at least a portion of the electrode 248b of the upper level transistor and is therefore also arranged vertically above at least a portion of the sacrificial cap 240b and the interconnect 220b. The gap 266 also extends beyond the vertical footprint of the electrode 248b, sacrificial cap 240b, and interconnect 220b such that the gap 266 is also arranged vertically above a portion of the ILD layer 260 of the upper level transistor 246 that is horizontally adjacent to the electrode 248b of the upper level transistor 246 and the sacrificial cap 240b.

Figure 2H:
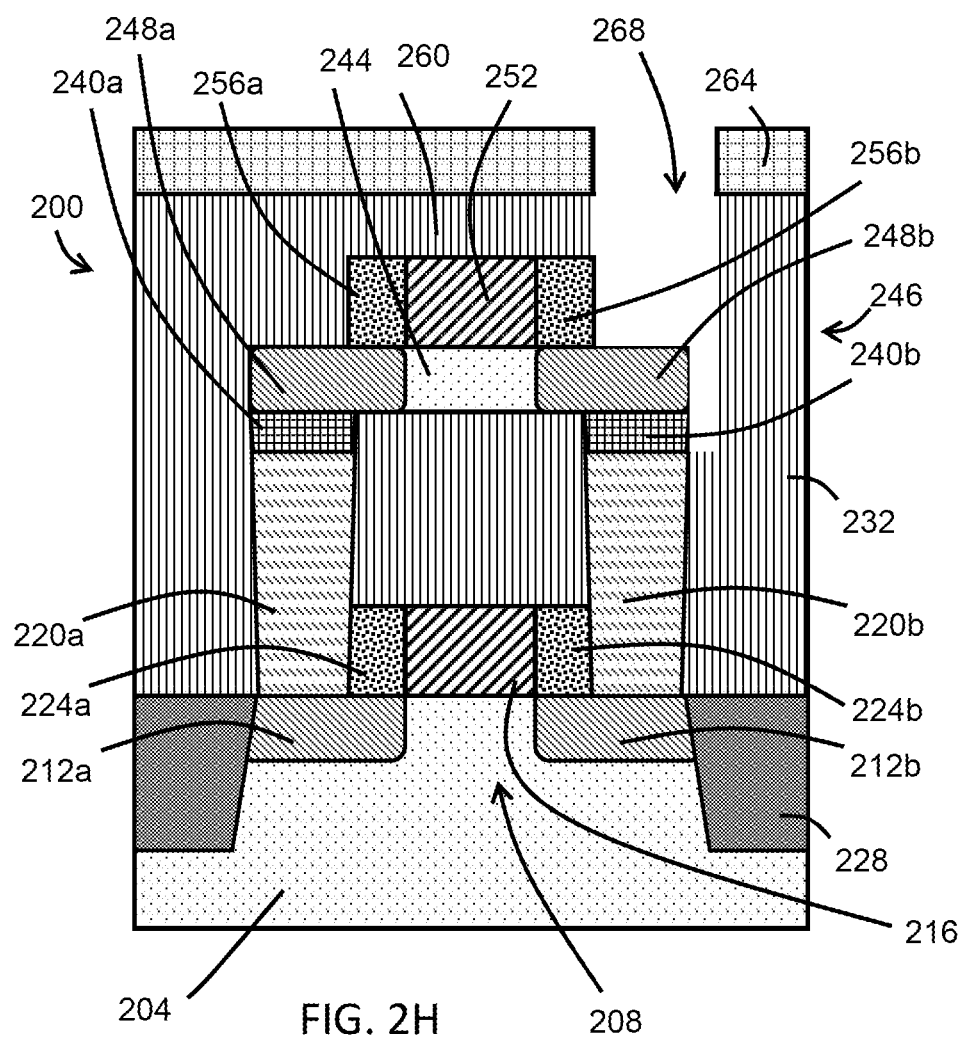
FIG. 2H illustrates a cross-sectional schematic view of an example of a structure following the performance of a portion of the example method of FIG. 1, in accordance with embodiments of the present disclosure.
Figure 21:
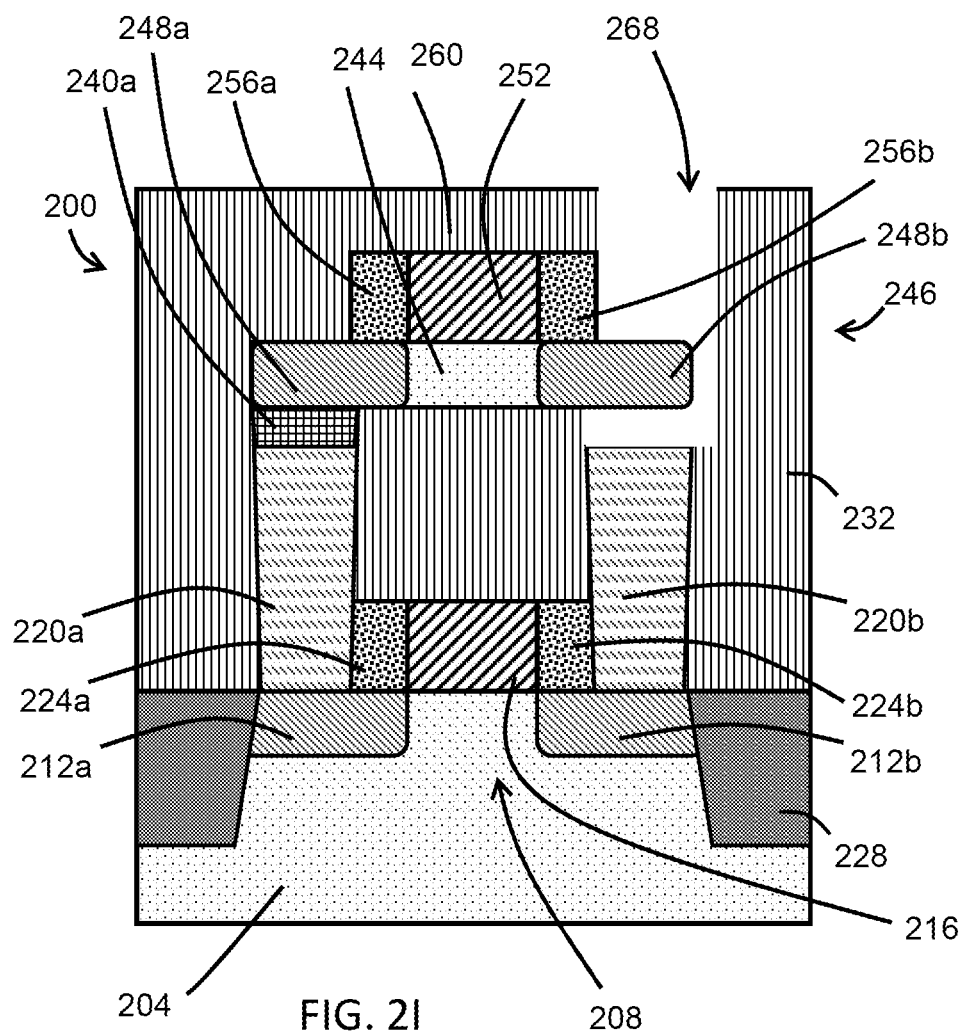

As illustrated in FIG. 2H, the arrangement of the gap 266 (shown in FIG. 2G) in this manner is notable because it determines the extent of the removal of material in subsequent processes to form an opening, which in turn determines the location of the local vertical interconnect. More specifically, FIG. 2H depicts the example structure 200 following the performance of a subsequent portion of operation 112. In particular, FIG. 2H depicts the example structure 200 following the removal of a portion of the ILD layer 260 of the upper level transistor 246 and a portion of the ILD layer 232 of the lower level transistor 208 vertically aligned with the gap. Accordingly, FIG. 2H depicts the example structure 200 including an opening 268 that is delimited by the ILD layers 260, 232, by the spacer 256b, by the electrode 248b, and by the sacrificial cap 240b.

In accordance with at least one embodiment of the present disclosure, the removal of the portions of the ILD layers 260, 232 to form the opening 268 can be performed by a dielectric RIE. In accordance with at least one embodiment of the present disclosure, the removal of the portions of the ILD layers 260, 232 can be controlled such that the portion of the ILD layer 232 is removed vertically downwardly to an extent such that the bottom of the opening 268 is substantially level with the bottom of the sacrificial cap 240b.

FIG. 2I depicts the example structure 200 following the performance of a subsequent portion of operation 112 in accordance with at least one embodiment of the method 100. In particular, FIG. 2I depicts the structure 200 following the removal of the photoresist layer 264 and of the sacrificial cap 240b (shown in FIG. 2H). In accordance with at least one embodiment of the present disclosure, the sacrificial cap 240b can be removed by performing a strip procedure using a chemical substance specifically selected to remove the sacrificial cap 240b.

As shown in FIG. 2I, upon removal of the sacrificial cap 240b, the opening 268 is delimited by the ILD layers 260, 232, by the spacer 256b, by the electrode 248b, and by the interconnect 220b.

Returning to FIG. 1, following the performance of operation 112, the method proceeds with operation 116, wherein an interconnect is formed. More specifically, an upper level interconnect is formed in the opening such that the interconnect is in direct contact with the interconnect of the lower level transistor. As such, a local vertical interconnect is formed between the upper level transistor and the lower level transistor. Because the opening was delimited in part by the interconnect of the lower level transistor from which the sacrificial cap was removed, the upper level interconnect formed in that opening is in direct contact with that lower level interconnect. In accordance with at least one embodiment of the present disclosure, the forming the upper level interconnect includes performing a metallization in the opening followed by a CMP procedure.

Figure 2J:
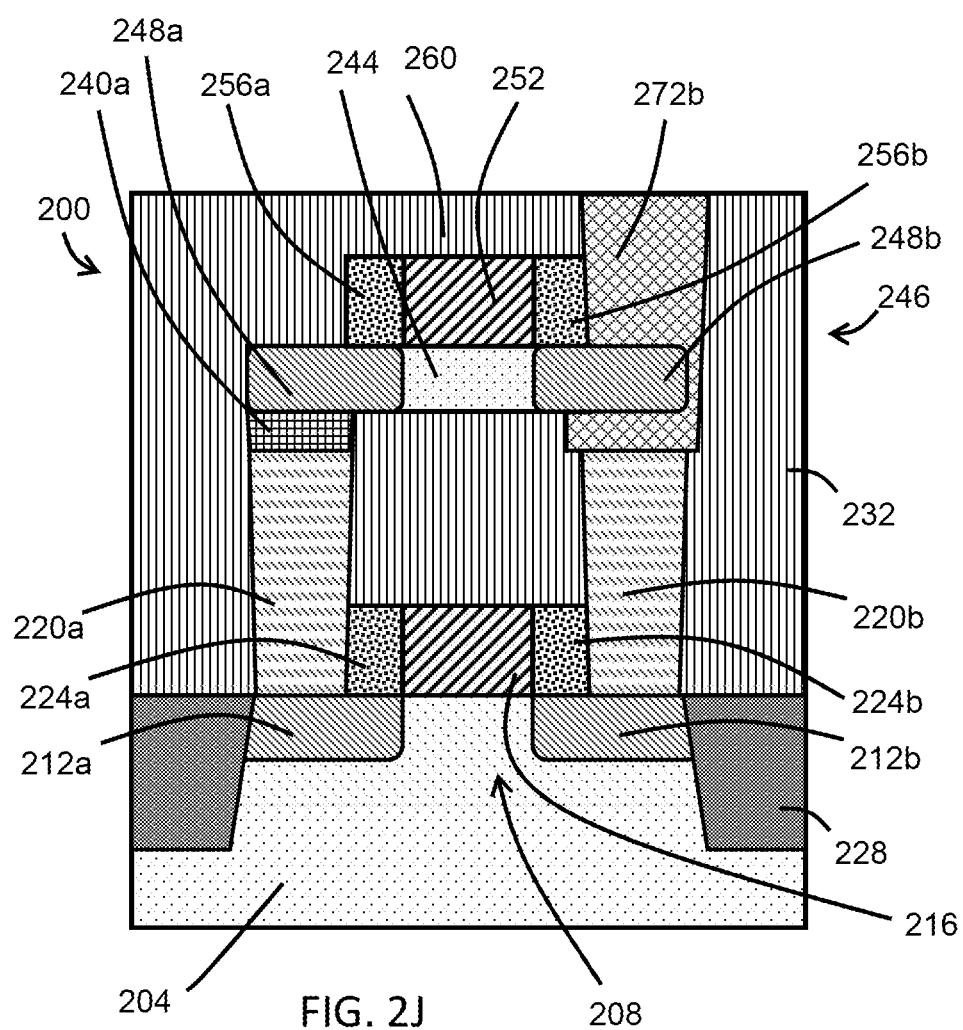
FIG. 2J illustrates a cross-sectional schematic view of an example of a structure following the performance of a portion of the example method of FIG. 1, in accordance with embodiments of the present disclosure.

FIG. 2J depicts the example structure 200 following the performance of a portion of operation 116 in accordance with at least one embodiment of the method 100. In particular, FIG. 2J depicts an upper level interconnect 272b formed in the opening 268 (shown in FIG. 2I). Accordingly, the upper level interconnect 272b is in direct contact with the electrode 248b of the upper level transistor 246 and with the interconnect 220b of the lower level transistor 208. Therefore, the upper level interconnect 272b forms a local vertical interconnect between the upper level transistor 246 and the lower level transistor 208.

In at least one embodiment of the present disclosure, the method 100 further includes forming another upper level interconnect that is in contact with the other electrode of the upper level transistor. In other words, in such embodiments, the method 100 further includes forming an interconnect that does not form a local vertical interconnect between the upper level transistor and the lower level transistor but that provides functionality to the corresponding electrode of the upper level transistor. In accordance with such embodiments, the other upper level interconnect can be formed using a conventional sequence of masking, etching, metallizing, and CMP.

Figure 2K:
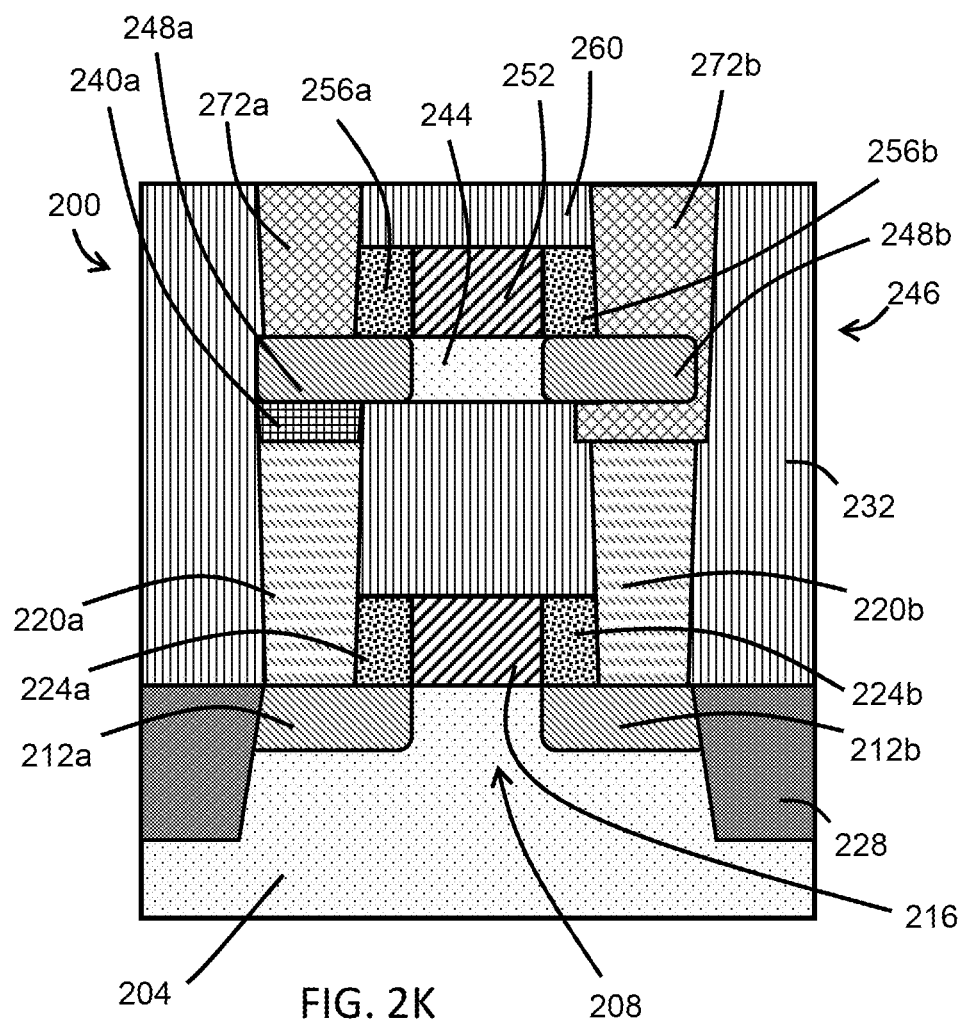
FIG. 2K illustrates a cross-sectional schematic view of an example of a structure following the performance of a portion of the example method of FIG. 1, in accordance with embodiments of the present disclosure.

FIG. 2K depicts the example structure 200 following the performance of such an operation in such embodiments. As shown in FIG. 2K, the upper level interconnect 272a is formed in contact with the electrode 248a of the upper level transistor. Accordingly, FIG. 2K depicts an example of the completed structure 200 in accordance with at least some embodiments of the present disclosure.

FIGS. 2G-2K depict the removal of the sacrificial cap 240b and the subsequent formation of the upper level interconnect 272b in contact with the interconnect 220b as an illustrative example. As mentioned above, it is possible to selectively remove sacrificial cap 240a instead of or in addition to the sacrificial cap 240b. Additionally, it is possible to remove neither sacrificial cap in the illustrative example structure 200 and to remove one or more corresponding sacrificial caps from one or more corresponding structures that are otherwise substantially similar in structure and function to the illustrative example structure 200. Thus, it is possible to form an upper level interconnect in contact with the interconnect 220a instead of or in addition to the interconnect 220b and/or to form an upper level interconnect in contact with one or more corresponding interconnects that is otherwise substantially similar in structure and function to the interconnects of the illustrative example structure 200.

FIGS. 3A-3I depict another example structure 300 that can be formed during the performance of method 100. For illustrative purposes, FIGS. 3A-3I depict a schematic cross-sectional diagram of the example structure 300 in a view that is rotated relative to that in which the example structure 200 was shown. In particular, the view of the example structure 300 is rotated approximately 90° about a vertical axis relative to the view of the example structure 200.

Figures 3A, 3B:
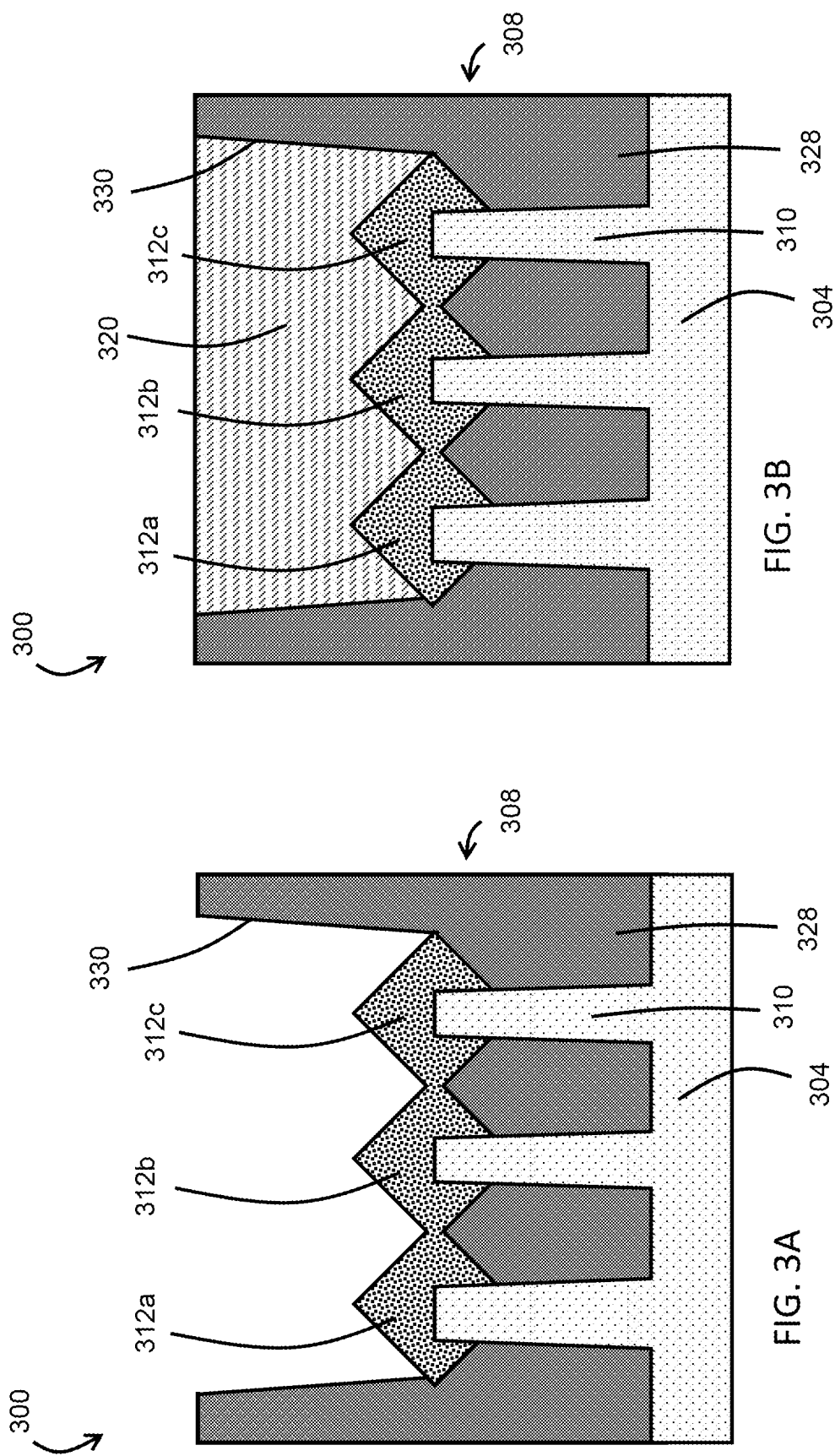
FIG. 3A illustrates a cross-sectional schematic view of an example of a structure for use in the performance of the example method of FIG. 1, in accordance with embodiments of the present disclosure.
FIG. 3B illustrates a cross-sectional schematic view of an example of a structure for use in the performance of the example method of FIG. 1, in accordance with embodiments of the present disclosure.

FIG. 3A depicts an example structure 300 that can be used in the performance of the method 100 prior to the performance of operation 104. Like the example structure 200, the example structure 300 also includes a wafer 304 on which the monolithic stack transistor is built and a lower level transistor 308 built on the wafer 304 that may be constructed using conventional techniques. The lower level transistor 308 includes silicon fins 310 on which epitaxy materials are grown to form source and drain electrodes 312a, 312b, 312c. The lower level transistor 308 also includes a gate that is substantially similar in structure and function to the gate 216 described above with reference to structure 200. However, the gate of the lower level transistor 308 is not visible in the view shown in the figures.

The lower level transistor 308 further includes a shallow trench isolation (STI) layer 328 around the source and drain electrodes 312a, 312b, 312c and a trench 330 formed above the electrodes 312a, 312b, 312c in the STI layer 328. In other words, the trench 330 is delimited by the STI layer 328 and by the electrodes 312a, 312b, 312c.

FIG. 3B depicts the structure 300 following the formation of an interconnect 320 of the lower level transistor 308. The interconnect 320 is formed in the trench 330 so as to be in direct contact with the electrodes 312a, 312b, 312c and with the STI layer 328 above the electrodes 312a, 312b, 312c.

FIG. 3C depicts the structure 300 following the performance of operation 104 of the method 100. More specifically, FIG. 3C depicts the structure 300 including a sacrificial cap 340 formed in a recess that was formed in the uppermost surface of the interconnect 320. Because the interconnect 320 was formed in direct contact with the STI layer 328 above the electrodes 312a, 312b, 312c, the recess was delimited by the STI layer 328 and the interconnect 320. Therefore, the sacrificial cap 340 formed in the recess is formed in the STI layer 328. In other words, the sacrificial cap 340 is delimited by the STI layer 328. In contrast, as noted above, the sacrificial caps 240a, 230b formed during the formation of the structure 200, were formed in and delimited by an ILD layer.

FIG. 3D depicts the structure 300 following the performance of a portion of operation 108 in accordance with at least one embodiment of the method 100. In particular, FIG. 3D depicts the example structure 300 following the formation of a wafer 344 of an upper level transistor 346. As shown, the wafer 344 is formed in direct contact with the sacrificial cap 340. Additionally, the wafer 344 is formed in direct contact with the STI layer 328. In contrast with the wafer 244 formed during the formation of the structure 200, the wafer 344 is not formed in direct contact with an ILD layer.

FIG. 3E depicts the example structure 300 following the performance of another portion of operation 108 in accordance with at least one embodiment of the method 100. In particular, FIG. 3E depicts the example structure 300 following the growth of epitaxy material 348 that forms source and drain electrodes of the upper level transistor 346. As with the lower level transistor 308, the gate of the upper level transistor 346 is not visible in the view shown in FIG. 3E. FIG. 3E further depicts the example structure 300 following the formation of an ILD layer 360 of the upper level transistor 346. In particular, the ILD layer 360 extends downwardly to the STI layer 328 of the lower level transistor 308.

FIG. 3F depicts the example structure 300 following the performance of a portion of operation 112 in accordance with at least on embodiment of the method 100. In particular, FIG. 3F depicts the example structure 300 following the formation of a photoresist layer 364 that includes a gap 366. As shown, the gap 366 is arranged generally vertically above at least a portion of the epitaxy material 348 that forms source and drain electrodes of the upper level transistor 346 and is therefore also arranged vertically above at least a portion of the sacrificial cap 340 and the interconnect 320. The gap 366 also extends beyond the vertical footprint of the epitaxy material 348 that forms source and drain electrodes of the upper level transistor 346 such that the gap 366 is also arranged vertically above a portion of the ILD layer 360 of the upper level transistor 346 that is horizontally adjacent to the epitaxy material 348 that forms source and drain electrodes of the upper level transistor 346.

Figure 3H:
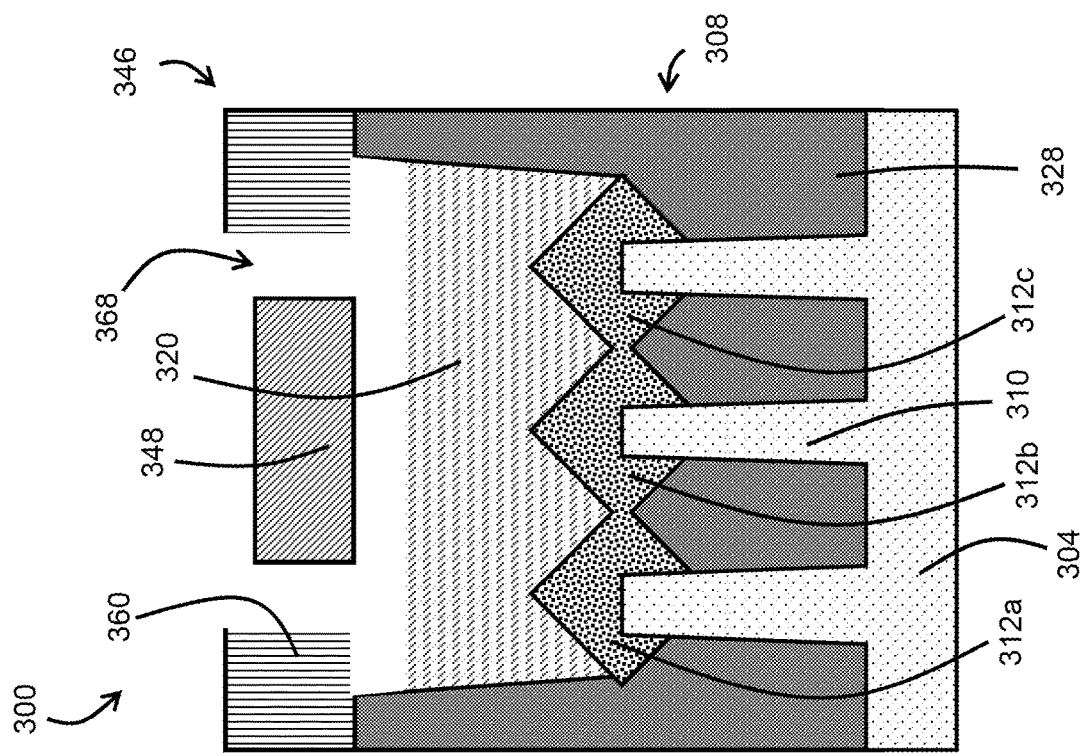
FIG. 3H illustrates a cross-sectional schematic view of an example of a structure following the performance of a portion of the example method of FIG. 1, in accordance with embodiments of the present disclosure.
Figure 3G:
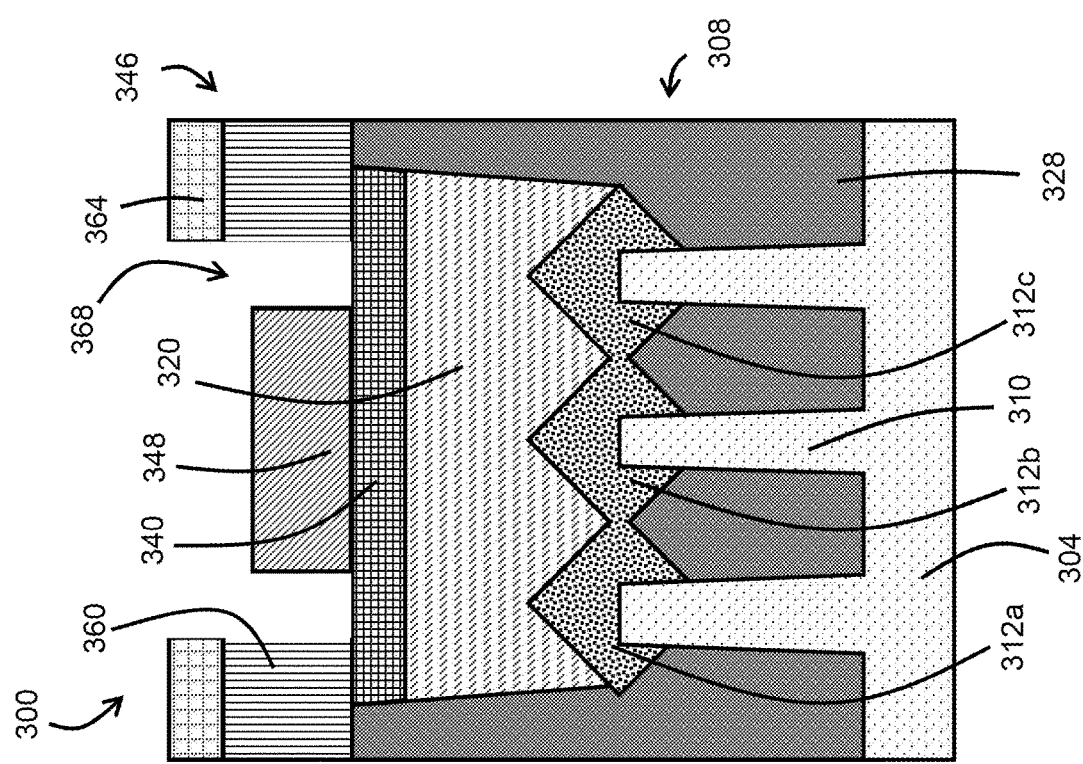
FIG. 3G illustrates a cross-sectional schematic view of an example of a structure following the performance of a portion of the example method of FIG. 1, in accordance with embodiments of the present disclosure.

FIG. 3G depicts the example structure 300 following the performance of a subsequent portion of operation 112. In particular, FIG. 3G depicts the example structure 300 following the removal of a portion of the ILD layer 360 of the upper level transistor 346 vertically aligned with the gap 366 (shown in FIG. 3F). Accordingly, FIG. 3G depicts the example structure 300 including an opening 368 that is delimited by the ILD layer 360, by the epitaxy material 348 that forms source and drain electrodes of the upper level transistor 346, and by the sacrificial cap 340. In accordance with at least one embodiment of the present disclosure, the removal of the portions of the ILD layer 360 can be controlled such that the portion of the ILD layer 360 is removed vertically downwardly to an extent such that the bottom of the opening 368 is substantially level with the top of the sacrificial cap 340.

FIG. 3H depicts the example structure 300 following the performance of a subsequent portion of operation 112 in accordance with at least one embodiment of the method 100. In particular, FIG. 3H depicts the structure 300 following the removal of the photoresist layer 364 and of the sacrificial cap 340 (shown in FIG. 3G). As shown in FIG. 3H, upon removal of the sacrificial cap 340, the opening 368 is delimited by the ILD layer 360, by the epitaxy material 348 that forms source and drain electrodes of the upper level transistor 346, by the STI layer 328 of the lower level transistor 308, and by the interconnect 320 of the lower level transistor 308. In contrast, as discussed above, the opening 268 formed during the formation of the structure 200 was not delimited by the STI layer 228.

Figure 3I:
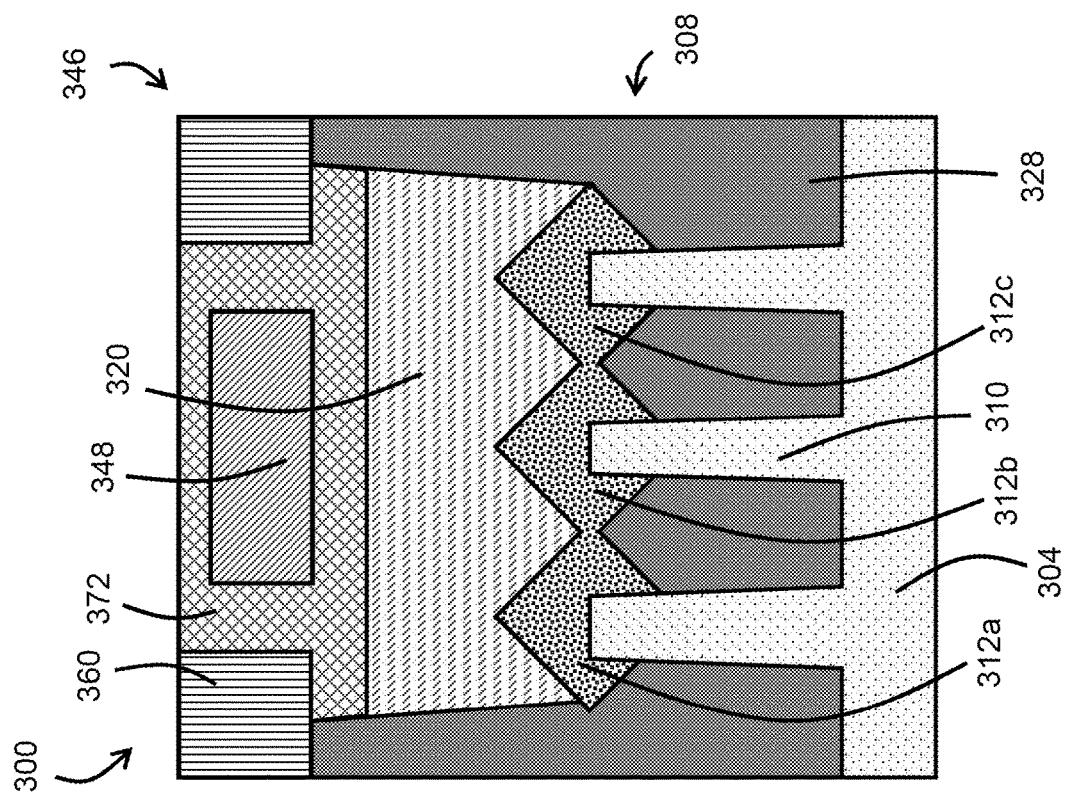
FIG. 3I illustrates a cross-sectional schematic view of an example of a structure following the performance of a portion of the example method of FIG. 1, in accordance with embodiments of the present disclosure.

FIG. 3I depicts the example structure 300 following the performance of at least a portion of operation 116 in accordance with at least one embodiment of the method 100. In particular, FIG. 3I depicts an upper level interconnect 372 formed in the opening 368. Accordingly, the upper level interconnect 372 surrounds and is in direct contact with the epitaxy material 348 that forms source and drain electrodes of the upper level transistor 346 and with the interconnect 320 of the lower level transistor 308. Therefore, the upper level interconnect 372 forms a local vertical interconnect between the upper level transistor 346 and the lower level transistor 308.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. However, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor device, comprising:
   a lower level transistor including a first source, a first drain, a first interconnect in direct contact with one of the first source and the first drain, and a second interconnect in direct contact with the other of the first source and the first drain;
   an upper level transistor including a second source, a second drain, a third interconnect in direct contact with one of the second source and the second drain, and a fourth interconnect in direct contact with the other of the second source and the second drain;
   a dielectric layer arranged between the lower level transistor and the upper level transistor, the dielectric layer including a recess extending to the second interconnect; and
   a dielectric cap formed in the recess and arranged in direct contact with the second interconnect,
   wherein the first interconnect and the second interconnect are arranged between the lower level transistor and the upper level transistor.

2. The semiconductor device of claim 1, wherein the second interconnect is separated from the fourth interconnect by the dielectric cap and by the other of the second source and the second drain.

3. The semiconductor device of claim 1, wherein the third interconnect is in direct contact with the first interconnect.

4. The semiconductor device of claim 1, wherein the third interconnect surrounds the one of the second source and the second drain.

5. The semiconductor device of claim 1, wherein:
   the third interconnect is in direct contact with a first surface, a second surface, and a third surface of the one of the second source and the second drain, the first surface, the second surface, and the third surface facing in different directions than one another.

6. The semiconductor device of claim 5, wherein the second interconnect is separated from the fourth interconnect by the dielectric cap and by the other of the second source and the second drain.

7. The semiconductor device of claim 5, wherein the third interconnect is in direct contact with the first interconnect.

\* \* \* \* \*